(12) United States Patent
Holderer et al.

(10) Patent No.: US 7,090,362 B2
(45) Date of Patent: Aug. 15, 2006

(54) FACET MIRROR HAVING A NUMBER OF MIRROR FACETS

(75) Inventors: Hubert Holderer, Oberkochen (DE); Andreas Heisler, Steinheim (DE); Wolfgang Singer, Aalen (DE); Markus Weiss, Aalen (DE); Andreas Seifert, Aalen (DE); Frank Melzer, Utzmemmingen (DE); Heinz Mann, Aalen (DE)

(73) Assignee: Carl Zeiss SMT AG, (DE)

( * ) Notice: Subject to any disclaimer, the term of this patent is extended or adjusted under 35 U.S.C. 154(b) by 0 days.

(21) Appl. No.: 10/841,846

(22) Filed: May 7, 2004

(65) Prior Publication Data

US 2005/0030656 A1    Feb. 10, 2005

Related U.S. Application Data

(63) Continuation-in-part of application No. PCT/EP02/11773, filed on Oct. 22, 2002, and a continuation-in-part of application No. PCT/EP02/12792, filed on Nov. 15, 2002.

(30) Foreign Application Priority Data

Nov. 9, 2001   (DE) .............................. 101 55 261
Dec. 12, 2001  (DE) .............................. 101 60 932

(51) Int. Cl.
*G02B 26/08* (2006.01)
*G02B 7/18* (2006.01)

(52) U.S. Cl. ................ 359/851; 359/858; 359/298; 359/198

(58) Field of Classification Search ................ 359/855, 359/865, 850, 851, 853, 296, 618, 619, 627, 359/858, 879, 290, 864, 298
See application file for complete search history.

(56) References Cited

U.S. PATENT DOCUMENTS

| 4,195,193 A | 3/1980 | Grabbe et al. | 174/52 FP |
|---|---|---|---|
| 4,195,913 A * | 4/1980 | Dourte et al. | 359/853 |
| 4,616,909 A * | 10/1986 | Dane | 359/853 |
| 4,740,276 A | 4/1988 | Marmo et al. | 204/7 |
| 6,154,302 A | 11/2000 | Yagi et al. | 359/198 |
| 6,227,673 B1 | 5/2001 | O'Hara-Smith | 359/850 |
| 2002/0131148 A1* | 9/2002 | Engler et al. | 359/296 |
| 2002/0181069 A1* | 12/2002 | Brown et al. | 359/290 |

FOREIGN PATENT DOCUMENTS

| DE | 23 63 765 | 6/1975 |
|---|---|---|
| DE | WO 98/14815 | 4/1998 |

(Continued)

*Primary Examiner*—Mark A. Robinson
*Assistant Examiner*—Mark Consilvio
(74) *Attorney, Agent, or Firm*—GrayRobinson, PA (57) ABSTRACT

In a facet mirror with a number of mirror facets, wherein the mirror facets are provided with reflecting surfaces, the mirror facets are mounted jointly in a basic body via bearing devices. The mirror facets comprise mirror bodies contacting at the periphery with the bearing devices via a surface, line or point contact. The preferred field of use of the facet mirrors is a projection objective of a projection exposure machine in microlithography for fabricating semiconductor elements.

10 Claims, 4 Drawing Sheets

FOREIGN PATENT DOCUMENTS

| | | |
|---|---|---|
| DE | EP 0 901 992 A2 | 3/1999 |
| DE | EP 0 726 479 B1 | 5/2002 |
| EP | 0 916 984 A1 | 5/1999 |
| GB | 2 255 195 A | 10/1992 |
| JP | 62054210 | 3/1987 |
| JP | 07199038 | 8/1995 |
| JP | 07333528 A * | 12/1995 |
| JP | 09096757 | 4/1997 |
| JP | 2000167683 | 6/2000 |
| RO | 101091 A * | 5/1991 |
| RO | 101091 | 12/1992 |

* cited by examiner

Fig. 7 much wider than, for example with piezoelectric actua-
FACET MIRROR HAVING A NUMBER OF MIRROR FACETS This is a continuation-in-part of copending application(s) International Application No. PCT/EP02/11773 filed on Oct. 22, 2002 which claims priority under 35 U.S.C. §120 to German Application No. 101 55 261.0 filed Nov. 9, 2001 and PCT/EP02/12792 filed on Nov. 15, 2002 which claims priority under 35 U.S.C. §120 to German Application No. 101 60 932.9 filed Dec. 12, 2001 and which designate the U.S.

BACKGROUND OF THE INVENTION

1. Field of the Invention

The invention relates to a facet mirror comprising a number of mirror facets, wherein the mirror facets are provided with reflecting surfaces and a bearing device in each case, to a system for adjusting the mirror facets of a facet mirror, and to the use of such a facet mirror in microlithography.

2. Description of the Related Art

Reference is made to EP 0 726 479 A2, EP 0 901 992 A1, GB 2 255 195 A, DE 23 637 65, Patent Abstract of Japan 2000 167683A, RO 101091B, U.S. Pat. No. 6,154,302 A, U.S. Pat. No. 6,227,673 B U.S. Pat. No. 1, 4,195,913 and U.S. Pat. No. 4,740,276 in relation to the prior art.

It is scarcely possible in the case of the known facet mirrors to realize the accuracies required for the mirror facets during adjustment, which are required for the preferred application of the above-named invention in an objective for semiconductor lithography, in particular for use under radiation in the extreme ultraviolet region. Moreover, during an adjustment of the mirror facets it is possible to access the individual mirror facets only from the side of their reflecting surface, and so aligning the individual mirrors under illumination is relatively complicated and difficult.

SUMMARY OF THE INVENTION

It is therefore an object of the invention to avoid the above-named disadvantages of the prior art and to create a facet mirror for a number of mirror facets that has a very simple design and good adjusting and fixing possibilities in conjunction with good thermal dissipation.

According to the invention, this object is achieved in the case of a facet mirror comprising a number of mirror facets that are provided with reflecting surfaces by virtue of the fact that the mirror facets are respectively mounted jointly in or on a basic body via bearing devices, and have mirror bodies which contact at the periphery with the bearing devices via a surface-, line- or point-contact.

Each reflecting surface can be introduced into a spherical or conical body that serves simultaneously as bearing body for bearing the mirror facets in the bearing device. This creates a design that permits each mirror facet to be capable of being adjusted freely and independently of the other mirror facets. The design of the mirror facets from a sphere as mirror and bearing bodies is thereby very simple and cost effective.

According to the invention, the reflecting surface can be arranged in a recess in the mirror body, for example in the refinement as a spherical body.

Further advantages arise from the possibility of fabricating the mirror body separately from the actual reflecting surface, and then connecting said bodies by means of joining methods known per se such as, for example, bonding, soldering, wringing, pinning, screwing or the like. Particularly in the case of use in the field of EUV lithography, that is to say at wavelengths in the region of approximately 13 nm, the reflecting surface must satisfy extremely high demands placed on the surface quality. In the case of a design in which the reflecting surface is not introduced directly into the basic body, the possibility arises here of using another material for the region of the reflecting surface, or of treating in a correspondingly different way the material which is possibly also the same. It is thereby possible to achieve the required surface quality in the region of the reflecting surface without the need to treat the entire mirror body in a correspondingly complicated way, or for it to consist of a material that can be so treated.

In a particularly advantageous development of the invention, the adjustment of the mirror facets can be performed under illumination such that the actually present conditions for example of a thermal nature are already present for the mirror facets during the adjustment. Owing to the possibility of adjustment from the side of the mirror facets that is averted from the reflecting surface, there is in this case no disturbance of the illumination and, therefore, of the conditions by the operation of the adjustment itself. Moreover, the adjustment can be performed with the aid of the result of the illumination itself such that the accuracy to be achieved can be improved under the actual, later conditions of use.

Such a facet mirror can be used with particular advantage as a mirror in an objective for semiconductor lithography, in particular, here, for lithography employing the extreme ultraviolet (EUV) as radiation.

Facet mirrors that lead the EUV radiation in the objective via a multiplicity of individually freely adjustable mirror facets have proved to be particularly advantageous for such objectives.

In a further refinement of a facet mirror, the object set is achieved by virtue of the fact that in each case the side of the mirror facet averted from the reflecting surface is of spherical construction.

The spherical back surface permits an ideal adjustment of each individual one of the mirror facets, generally approximately 50 to 250 items, of a facet mirror constructed therefrom The spherical back surface enables the tilting of the reflecting surface, which can be constructed, for example, as a spherical surface, as an asphere, and as a planar, torroidal or cylindrical surface, without moving the mirror facets per se from their position.

In accordance with a particularly favorable refinement of the invention, the object set with regard to the mirror facets for a facet mirror is achieved by providing that the reflecting surface of the mirror facet is of spherical construction, the side of the mirror facet averted from the reflecting surface likewise being of spherical construction, and the two spheres having different centers.

The two different centers of the—not necessarily—spherical reflecting surface and of the spherical back surface of the mirror facet produce a design that ideally permits the reflecting surface to be aligned and to be displaced appropriately. Specifically, when executing a lateral movement the mirror will execute a pivoting movement on its spherical back surface by an appropriate radius. This pivoting movement takes place about the center of the sphere of the back surface. Since it has another center, the reflecting surface experiences a movement supported in another way such that the, central axis of the reflecting surface is displaced and simultaneously experiences tilting. The mirror facet can therefore ideally conform to the prescribed requirements.

All that is important in this case for the desired mode of operation is that there should be no coincidence between the center of the spherical back surface and the center of the spherical reflecting surface or, in the case of a non-spherical reflecting surface, the center of its radius of vertex curvature.

Moreover, the above-named object is achieved in another refinement for a facet mirror in that the side of the mirror facet averted from the reflecting surface is of planar configuration in each case.

Such a mirror facet can be appropriately displaced on this planar back surface in order to align its lateral position in the desired position. It is not possible with this arrangement for the axis of the mirror to be tilted.

In a particularly favorable development of this idea, it is now possible to provide that the side averted from the reflecting surface has a sphere, as has already been described above, which is arranged in a sphere, corresponding thereto, of an intermediate element that is constructed in a planar fashion on its side averted from the mirror facet.

It is thereby possible in accordance with the above-described procedure to achieve an alignment of the reflecting surface with regard to the tilting of its central axis in a particularly advantageous way by moving the mirror facet on the intermediate element along its spherically constructed back side. Parallel therewith, it is possible to align the intermediate element with its back side of planar construction, in accordance with the way described above for the configuration of the second mirror facet. The combination thus permits the creation of a mirror facet that can be ideally aligned.

It can be provided in a favorable development thereof that the mirror facet or, if appropriate, also the intermediate element has magnetic devices. It is possible to achieve as a result that the position of the mirror facet and, if appropriate, also of the intermediate element can be securely fixed, after alignment has been performed, by activating these magnetic devices, for example by switching on electromagnets.

When using mirror facets with planar back surfaces, and when using intermediate elements with planar back sides, the basic body should likewise have a planar surface on which the mirror facets or intermediate elements are mounted, and on which these can be displaced and aligned. The side of the basic body averted from the mirror facets need not be of planar construction in this case. Ideally, this back side has reinforcements in the form of struts or in the form of a honeycomb structure in order to be as stiff as possible together with the lightest possible design.

The alternative would be appropriate stipulations of shape for the basic body that would be suitable for holding the mirror facets with their spherical back surfaces. For this purpose, it would be possible, for example, to provide bores or the like that are of smaller diameter than the mirror facet itself and thus permit an annular support of the spherically constructed back surface of the mirror facet. By tilting the mirror facet, the movement, already explained above, of the mirror facet on its spherical back side can then be performed. Adequate possibilities for a movement or lifting can be achieved in this way.

In a particularly favorable development of the facet mirror, it is provided that, in the region in which the respective mirror facet is mounted on the basic body, the basic body respectively has an opening that runs from the side of the basic body facing the mirror facet in the direction of the side of the basic body averted from the mirror facet.

This opening can then be used for various purposes.

In accordance with a very favorable development of the invention, one possibility would be to introduce a pressure pad between the basic body and the mirror facet through the opening. In this case, it is possible to provide as opening a comparatively small hole or the like through which a fluid under pressure can be introduced between the mirror facet and the basic body. The movement of the mirror facet, in particular for alignment, is facilitated by virtue of the fact that the mirror facet then virtually "floats" on a pressure pad, and the friction otherwise present is largely suppressed.

In accordance with a further very favorable refinement of the invention, it is also possible to provide something comparable when the mirror facet is used together with the intermediate element. It would then be possible either for the intermediate element to float on the pressure pad, or it would also be conceivable, in accordance with a very favorable development of this idea, for the intermediate element likewise to have an opening such that the mirror facet can be supported in a floating fashion on the intermediate element via a pressure pad, or can be minimized in terms of friction for the purpose of adjustment.

Another possibility for using the opening could, for example, given an opening that has a somewhat larger diameter, also be the use with a retaining mandrel.

The retaining mandrel would then be required to have a diameter such that it is seated with lateral play for displacement in the opening. The retaining mandrel can then be used, working from the back side of the basic body, to adjust the mirror facet and/or, if appropriate, the intermediate element. In addition, the retaining mandrel permits the intermediate element and/or the mirror facet to be fastened on the basic body.

Aside from the classical connecting techniques, for example screwing on the retaining mandrel, or constructing it as a threaded rod such that said retaining mandrel could be secured against the basic body with the aid of a washer, that can, if appropriate be of a resilient construction, and a nut, the retaining mandrel can also have magnetic devices or be made from a material that can be magnetized. It is then possible to use electromagnetic devices or the like to exert a magnetic force on the retaining mandrel or, via the retaining mandrel, on the intermediate element and/or the mirror facet, which fixes the latter in its position. It would be possible in this case for the magnetic device either to remain on the retaining mandrel or, if the retaining mandrel consists of a material that can be magnetized permanently, the magnetic device could also be withdrawn after the magnetization of the retaining mandrel and, for example, be used for the retaining mandrel of the element, arranged adjacent thereto, of the facet mirror.

The permanently magnetized retaining mandrel and/or the permanently magnetized mirror facets and/or intermediate elements would then be fixed in its position in relation to the basic body, which must likewise be magnetically conducting, by attractive forces.

However, a direct contact between the basic body and the mirror facet and/or the intermediate element is provided in the case of all the structures, and so any heating of the mirror facet that may occur owing to partially absorbed radiation can be dissipated via the basic body.

In a further alternative refinement of the facet mirror, it is also possible to provide that the mirror facet and/or the intermediate element and/or the basic body are/is provided, at least in the regions in which these components touch one another, at least partially with a solder.

The solder, which can be applied, for example, as a coating on the components, or which can be held in reserve in corresponding recesses in the components, can be melted by heating up the mirror facets after their final alignment, such that a firm connection is produced after cooling between the mirror facets and/or the intermediate elements and/or the basic body and ideally secures the position of the reflecting surface and can, however, ensure an ideal dissipation of heat.

Furthermore, the above-named object is achieved by a system for aligning mirror facets of a facet mirror by virtue of the fact that the mirror facets are rotated about a center or laterally displaced on their side averted from the reflecting surface.

This alignment is very favorable and simple here, since only a single movement is required to alien the mirror facet appropriately, as has also already been explained above in describing the mirror facet itself.

Of course, to the extent that the mirror facet and/or the intermediate element do/does not have a spherical back surface, in an alternative method this can be achieved in a way similar to what has already been said above by means of an appropriate displacement or, if appropriate, of a tilting and a displacement in the case of the combination of mirror facet and intermediate element.

Moreover, the above-named object of the invention is achieved by a system for fixing the position of a mirror facet according to the above-named claims on a basic body in which the fixing of the position is realized by means of magnetic retaining forces.

An alternative refinement provides that the magnetic devices themselves are permanently magnetized, for example when these devices are constructed from an appropriate material suitable therefor and by converting these into permanent magnets via electromagnetic forces. This offers decisive advantages when it is desired for reasons of space or for other reasons not to have in the region of the facet mirror any lines or currents that would be necessary in order to maintain the electromagnetic devices with regard to their magnetic force.

A further alternative can provide that the mirror facets are soldered after the alignment with the basic body. This also offers good fastening in conjunction with a good thermally conducting connection such that any energy absorbed in the form of heat can be very easily dissipated.

A further alternative could provide that the mirror facets are wrung on the basic body after the alignment. This measure, which is often employed in the case of optical elements polished to a very good surface quality, can be used very advantageously, for example, in conjunction with the pressure pad already described above by introducing the pressure pad between the parts to be wrung as a modifiable pressure pad. After the performance of the alignment or adjustment of the position by lowering the pressure, it is possible to achieve a slow and quasi-continuous wringing such that no maladjustment any longer occurs owing to the wringing operation itself.

If, nevertheless, a further adjustment is necessary owing to aging or the like, the wringing could be canceled again by renewed introduction of a pressure pad, and the process could begin anew. The wringing thus results for the facet mirror in a very flexible system that is, if appropriate, very easy to demount again and yet permits very good fastening with very good thermally conducting properties between the individual components.

Further advantageous refinements of the invention emerge from the remaining subclaims and from the exemplary embodiments illustrated below with the aid of the drawings

DETAILED DESCRIPTION

Figure 1:
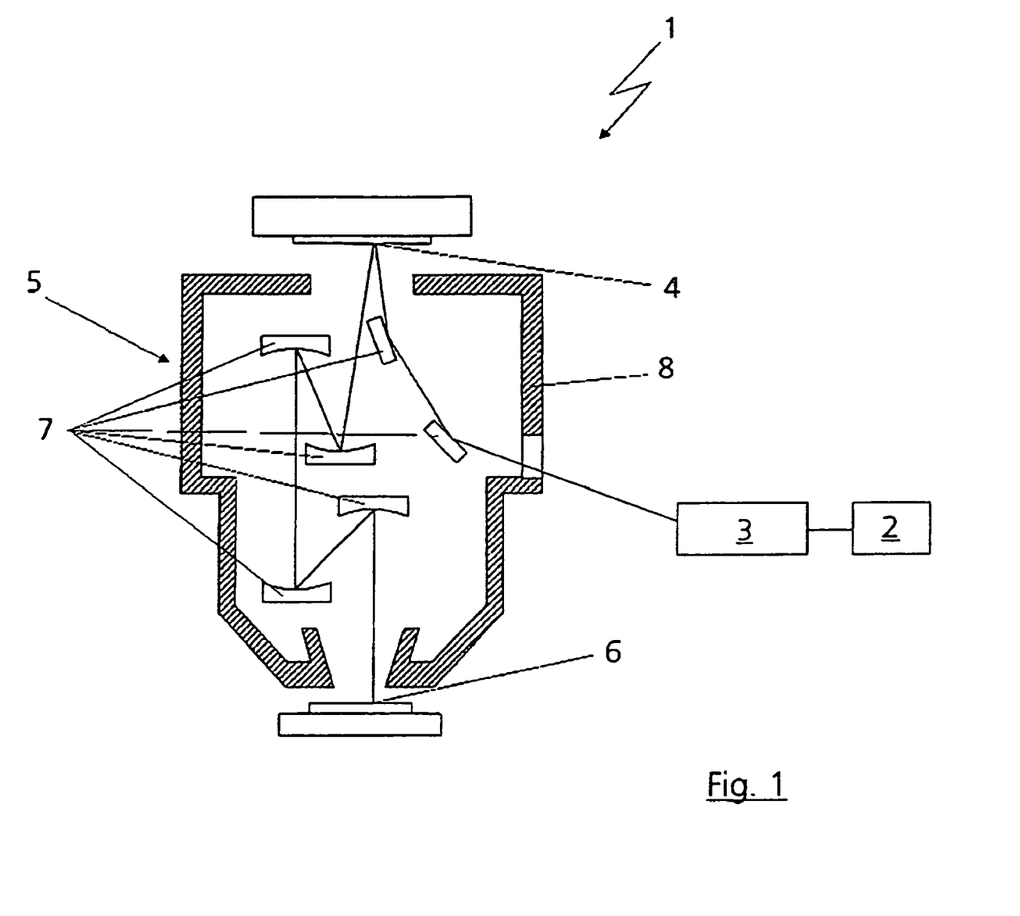
FIG. 1 shows a sketch of the design of an EUV projection exposure machine having a light source, an illuminating system and a projection objective.

As may be seen from FIG. 1, an EUV projection exposure machine 1 has a light source 2, an EUV illuminating system 3 for illuminating a field in a plane 4 in which a pattern-bearing mask (reticle) is arranged, as well as a projection objective 5 for imaging the pattern-bearing mask in the plane 4 onto a photosensitive substrate (wafer) 6 The projection objective 5 has a number of optical elements, in particular a mirror 7, in an objective housing 8.

Figure 2:
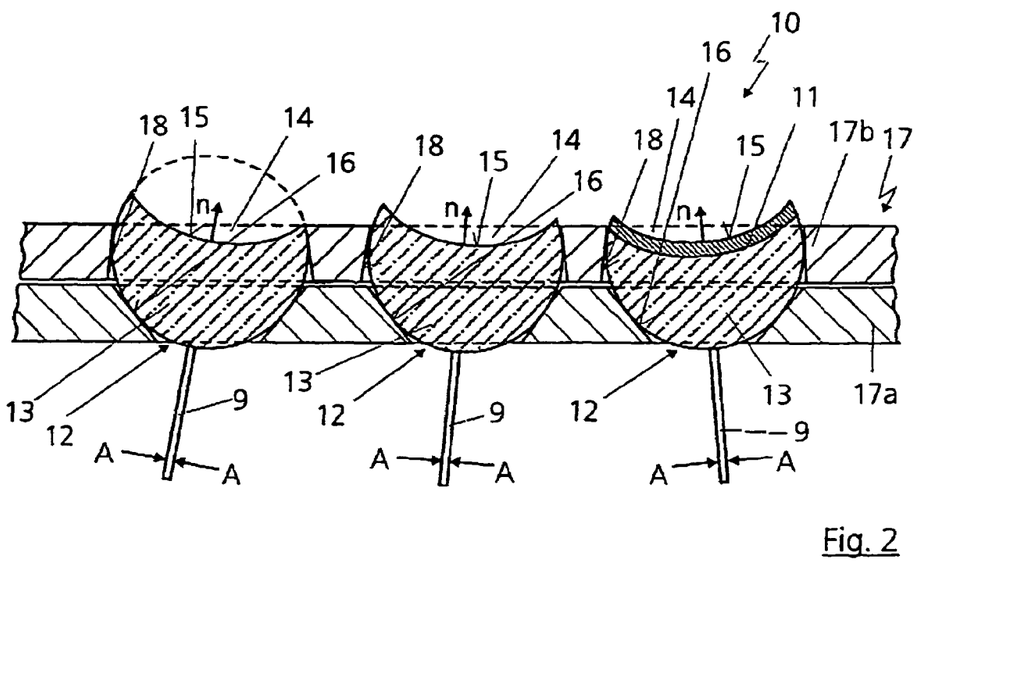
FIG. 2 shows a cross section through a design, possible in principle, of a facet mirror using mirror facets according to the invention.

A portion of a facet mirror 10 may be seen in the mirror facet of FIG. 2. The facet mirror has three mirror facets 12 in the exemplary embodiment illustrated here. Each of the mirror facets 12 has a mirror body 13 in the form of a spherical body. A recess 14 is located in each of the spherical bodies 13. The remaining surface of the spherical body 13 in the region of this recess 14 then forms a reflecting surface 15 that is additionally symbolized in each case by its surface normal n in the sole figure attached.

Instead of forming the reflecting surface directly in the recess 14 of the spherical body 13, it is possible to provide a separate reflecting part 11 for the reflecting surface 15 (see the mirror facet 12 illustrated on the right in FIG. 2). In this case, the reflecting part 11, in which the reflecting surface 15 with the required surface quality is introduced, is treated separately and subsequently inserted into the recess. A known joining method can be used for this purpose here.

Each of the mirror facets 2 is mounted in a bearing device. The bearing device consists in this case of a conical bore 16 that is introduced into a basic body 17 that is constructed in bipartite fashion in the form of a lower plate 17a and an upper plate 17b. The spherical body 3 is situated in this conical bore 16, whose larger opening diameter is arranged in this case such that the spherical body 13 is situated in the conical bore 16, but cannot fall through the latter.

Moreover, the bearing device has devices for securely retaining the spherical body 13. In accordance with the exemplary embodiment illustrated here, these devices are constructed as a further conical bore 18 that is provided in the upper plate 17*b*. For the purpose of better understanding, this upper plate 17*b* is denoted here below as upper carrier plate 17*b*. The larger aperture angle of the further conical bore 18 is arranged such that it faces the lower carrier plate 17*a*.

In addition to the construction of the devices for the secure retention by the upper carrier plate 17*b*, it would also be conceivable to have a different construction of these devices, for example using springs, using magnetic forces or the like.

Figure 3:
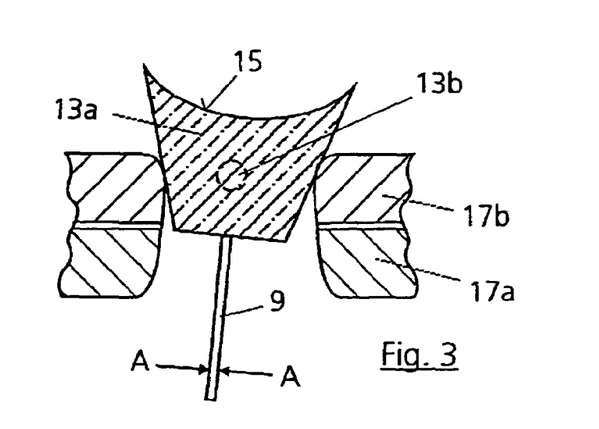
FIG. 3 shows a detail comprising a mirror facet in a configuration having a conical mirror body.

Instead of a spherical shape for the mirror body 13, it is also possible in accordance with FIG. 3 to provide a conical shape 13*a*. In this case, the bearing device is of spherical or torroidal configuration. In both cases, a low-friction linear contact is achieved in this way between the mirror body 13 or 13*a* and the bearing device. Instead of a surface or linear contact, it is also possible if required to achieve point contact by means of a number of knob-like projections arranged distributed over the periphery, as is indicated in FIG. 3 with the aid of the reference numeral "13*b*" by a dashed circle. In order to achieve good thermal dissipation, however, a relatively large contact region will generally be provided between the mirror bodies and the bearing devices.

It is now particularly favorable for the ideal mode of operation if an adjusting device is provided on each of the mirror facets 12 on its side averted from the reflecting surface 15. This adjusting device can be constructed, for example, as an actuator, connected to the spherical body 13, in the form of a lever element 9. Such a lever element 9, which projects through the conical bore 16 in the lower carrier plate 17*a*, can be used to adjust the facet mirror 10 in such a way from behind, that is to say from its side averted from the illumination, under illumination, that is to say under conditions provided for the proper operation. In this case, the transmission ratio between the movement of the reflecting surface 15 or its surface normal n and the deflection of the lever element 9 can be set by means of the length of the lever element 9. It is particularly rational here when the lever element 9 is constructed flush with the surface normal n of the reflecting surface 15.

It is very favorable if the position of the reflecting surface 15 is adjusted via corresponding forces on the side of the lever element 9 averted from the spherical body 13. These forces can, for example, be applied to the lever element 9 via actuators that are indicated here in principle by the arrows A. Conceivable in this case as actuators are all known forms of actuators that use, for example, pneumatic, hydraulic, piezoelectric, magnetic or mechanical forces.

The procedure in the adjustment of such a facet mirror 10 that can be used, for example, as a mirror 7 in the projection objective 5 for EUV lithography is, then, such that the mirror facets 12 are inserted into the conical bores 16 of the lower carrier plate 17*a*. Thereafter, the upper carrier plate 17*b* with its conical bores 18 is positioned over the mirror facets 12 and lowered. The two plates 17*a* and 17*b* then are situated loosely on one another such that the position of the mirror facets 12 can be further changed via the lever elements 9. Each individual reflecting surface 15 of the individual mirror facets 12 is then positioned under illumination of the entire facet mirror 10 via appropriate actions of force on the lever element 9. As soon as the position of all the mirror facets 12 has been adjusted in the desired way, this position is fixed by pressing the lower and upper plates 17*a* and 17*b* against one another. It is particularly favorable in this case when the lower carrier plate 17*a* is constructed from a material that is substantially softer than the material of the spherical bodies 13. A material combination of a ceramic or crystalline material for the spherical bodies 13 and a soft metal, such as brass, copper or aluminum, for the lower carrier plate 17*a* would be conceivable here, for example. By comparison therewith, the upper carrier plate 17*b* should consist of a material that is somewhat harder than the material of the lower carrier plate 17*a*, but which is also constructed to be substantially softer than the material of the spherical bodies 13. Thus, when the two plates 17*a* and 17*b* are compressed it is ensured that the spherical bodies 13 are pressed lightly into the lower carrier plate 17*a*, and that their position is ensured by frictional forces (even in the case of vibrations, shock or the like).

Should the final adjustment have experienced a maladjustment upon compression of the plates 17*a* and 17*b*, which can occur, for example, from screwing the two plates to one another, it is possible by loosening this screwed connection and by pressing the two plates 17*a* and 17*b* apart, for example by compressed air introduced therebetween, to achieve a state in which the friction between the lower carrier plate 17*a* and the spherical bodies 13 is diminished to such an extent that a renewed adjustment is possible before the two plates 17*a* and 17*b* are then pressed against one another again after the completed adjustment.

In order to ensure the finally adjusted position of the individual mirror facets 12, the latter could also additionally further be bonded or soldered to at least one of the plates 17*a* and 17*b*.

Figure 4:
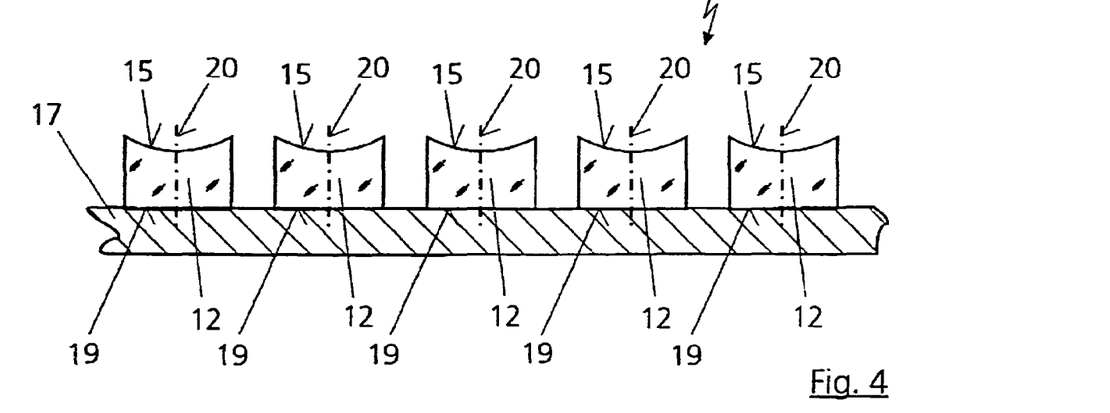
FIG. 4 shows a detail of an exemplary design for a facet mirror in another embodiment.

FIG. 4 shows a detail of a facet mirror 10 in another refinement. However, the same reference numerals have been retained for the same parts. The facet mirror 10 has a number of mirror facets 12. Each of the mirror facets 12 has, in turn, a reflecting surface 5 and a back surface 19 that is averted from the reflecting surface 15. Each mirror facet 12 is mounted on the basic body 17 or connected thereto via the back surface 19.

Starting from this basic design of a facet mirror 10, which always comprises a number of mirror facets 12, generally approximately 50 to 250 items, the aim below is to explain the possible design of the mirror facets 12 themselves in more detail with the aid of various embodiments The aim in this case is to form the facet mirror 10 indicated here in principle by always combining a number of mirror facets 12, if appropriate including a number of differently designed ones.

A preferred field of application of the facet mirror 10 is to use it for illuminating systems in microlithography (see FIG. 1) Such facet mirrors 10 are very favorable, particularly when use is also made of wavelengths in the region of the extreme ultraviolet (EUV), since in the case of such wavelengths no results, or much worse results by far, are to be achieved with regard to optical imaging quality via refracting optical elements than in the case of reflecting elements.

Figure 5:
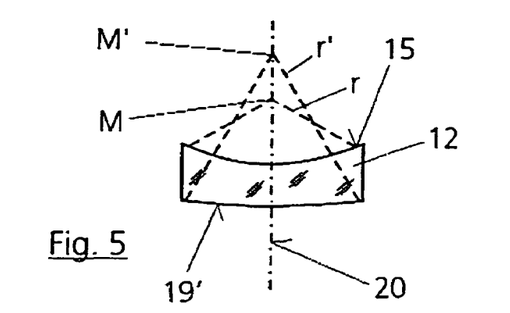
FIG. 5 shows a first embodiment for a design of a mirror facet.

FIG. 5 shows a first possible embodiment of the mirror facet 12. The mirror facet 12, which can consist, for example, of a mirror substrate, has the reflecting surface 15 already mentioned and a back surface 19'. By contrast with the back surfaces 19 illustrated in FIG. 4, the back surface 19' of the mirror facet 12 illustrated in FIG. 5 is denoted by the reference numeral 19', since it is in this case a spherical back surface, while the back surfaces illustrated above in the context of FIG. 1 are constructed as planar back surfaces 19. In order to distinguish more easily between these two types of back surfaces, the following discussion consistently retains the designation 19 for the planar back surface and the designation 19' for the spherical back surface.

As may be seen in the illustration in accordance with FIG. 5, the reflecting surface 15, which is of spherical construction here, although this is not mandatory, has a mirror radius r. The spherical reflecting surface 15 is therefore a sphere about a center M that accordingly corresponds to the radius r, and through which the optical axis 20 of the mirror facet 12 also runs. A center M' that forms the center of the spherical back surface 19' together with the associated radius r' does not lie in this case at the center M of the reflecting surface 15. If the mirror facet 12 is now mounted on the back surface 19', sliding occurs along the radius r' of the back surface 19' given a lateral displacement of the mirror facet 12. The mirror facet 12 thereby executes a pivoting movement about the center M'. The reflecting surface 15 simultaneously experiences tilting of its optical axis 20 and simultaneously experiences displacement of the same in a lateral direction. The changes in position required for the adjustment of such a mirror facet 12 can therefore be achieved very simply with only a single movement, resulting for the facet mirror 10 in a compact design that can be adjusted with the aid of relatively simple means when said mirror at least partially has the mirror facets 12 in accordance with FIG. 5.

Figure 6:
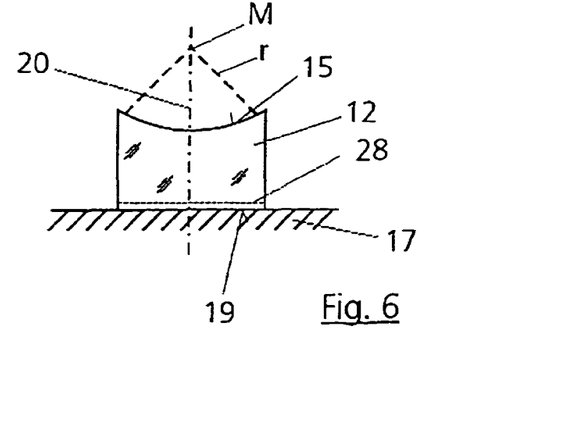
FIG. 6 shows a second possibility for the design of a mirror facet.

FIG. 6 shows a mirror facet 12 that fulfils in principle the same preconditions as the mirror facet 12 in accordance with FIG. 5. The sole difference of the mirror facet 12 illustrated here is that the latter has a planar back surface 19 such that the mirror facet 12 on the basic body 17, which has a planar surface and is illustrated here as a flat plate for the sake of simplicity, can be aligned in a plane perpendicular to its optical axis 20 by a lateral displacement on the basic body 17

The advantage of this mirror facet 12 certainly resides in the fact that a by far greater adjustment path is possible than in the case of the above-described mirror facet 12 in accordance with FIG. 5. However, no tilting of the optical axis 6 is possible here.

Figure 7:
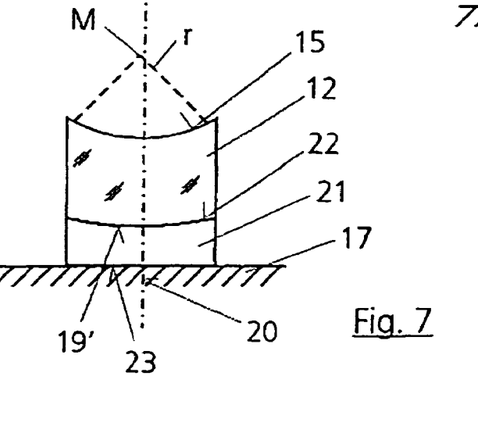
FIG. 7 shows a further embodiment for a mirror facet in combination with an intermediate element.

A mirror facet 12 that is of similar construction to the mirror facet 12 in accordance with FIG. 5 is now to be seen in the illustration of FIG. 7. The mirror facet 12 has a spherical back surface 19'. This spherical back surface 19' is not, however, in direct contact with the basic body 17, but rather there is an intermediate element 21 arranged between the back surface 19' and the basic body 17. On its side facing the mirror facet 12, the intermediate element 21 has a spherical surface 22 in which the corresponding spherical back surface 19' of the mirror facet 12 is located, and in which the mirror facet 12 can be moved in accordance with the above-described conditions. On a back surface 22 averted from the mirror facet 12, the intermediate element 21 has a planar surface 23 such that it can be aligned on the basic body 17 in the way that has already been described when explaining the mirror facet 12 in accordance with FIG. 6.

It is thereby possible to achieve by means of the mirror facet 12 and the intermediate element 21 in the design illustrated in accordance with FIG. 7 an arrangement that permits a very large adjustment path by a displacement of the intermediate element 21 on the basic body 17 perpendicular to the optical axis 20 of the mirror facet 12, and that permits tilting and, if appropriate, also slight displacement for the purpose of readjustment by means of the "spherization" of the mirror facet 12 with its spherical back surface 19' on the spherical surface 22 of the intermediate element 21.

The design in accordance with FIG. 7 therefore thereby offers the advantages of both systems previously described.

After the adjustment, which can be performed in the ways described above, it is then necessary to ensure that the position of the mirror facet 12 is fixed such that no renewed maladjustment or the like can come about in the region of the facet mirror 10.

Described below are a few possibilities for fixing the mirror facets 12 with, or if appropriate also without, a corresponding intermediate element 21 after adjustment has been performed. All the fixings are designed in this case such that direct contact occurs in each case between the individual elements such that these individual elements also remain in thermally conducting contact. This renders it possible for heat absorbed by the mirror facet 12 to be capable of dissipation via the mirror facet 12, if appropriate the intermediate element 21 and the basic body 17 such that there is no excessive heating of the mirror facets 12 that could be attended by a change in the surface shape of the reflecting surface 15, and therefore by losses with regard to the imaging quality.

Figures 8, 9, 10, 11:
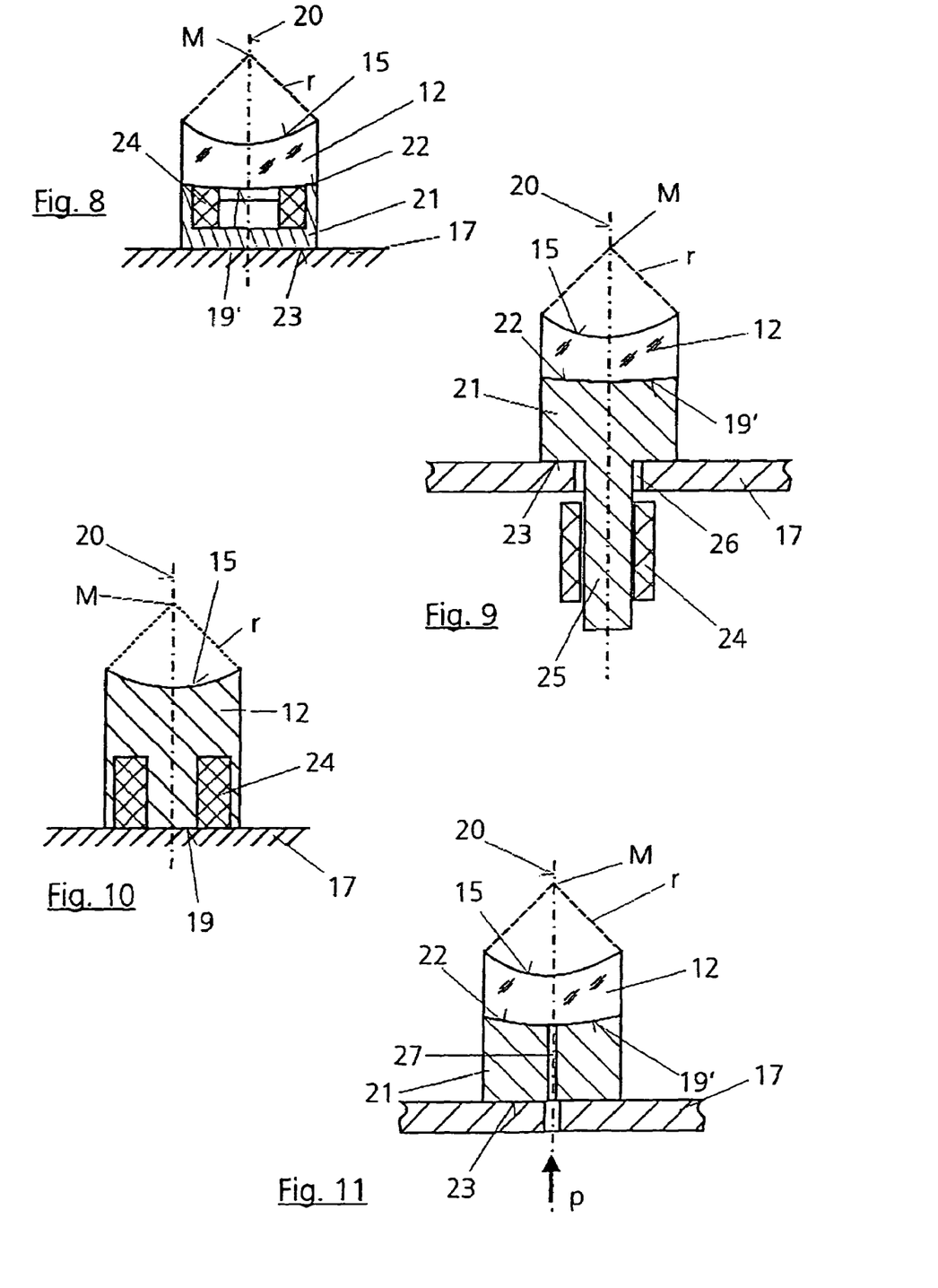
FIG. 8 shows an embodiment of a mirror facet having an intermediate element that has magnetic devices.
FIG. 9 shows an embodiment of a mirror facet in combination with an intermediate element that has magnetic devices in an alternative embodiment to FIG. 8.
FIG. 10 shows an embodiment of a mirror facet having magnetic devices.
FIG. 11 shows a further mirror facet having an intermediate element that has an opening for introducing a pressure pad.

FIGS. 8, 9 and 10 respectively show various versions of mirror facets 12 that can be fixed by means of magnetic retaining forces. In order to be able to implement such a design, there is a need in addition to the magnetic devices 24, which are indicated here only schematically, for materials for the mirror facets 12 that are themselves magnetic or magnetically conducting. Diverse steels, INVAR or the like could be examples here. When use is made of such substrates for the mirror facets 12, the latter would need, after the preproduction of the reflecting surface 15, to be covered on the same with a layer than can be polished, such as a layer of NiP, for example, that can be polished appropriately and can be coated as a mirror. Alternatively, of course, the reflecting surface 15 can also be formed on a separate mirror part 11 as is specified in conjunction with FIG. 2 in the mirror facet 12 illustrated at right.

FIG. 8 shows a design in which the magnetic devices 24, which are constructed as a coil here, are arranged in the intermediate element 21. The magnetic devices 24 in this case always remain in the region of the intermediate element and fix the mirror facet 12, the intermediate element 21 and the basic body 17 against one another by magnetic retaining forces.

FIG. 9 shows a comparable arrangement in which, however, the magnetic devices 24 can be removed after the magnetization of a retaining mandrel 25 connected to the intermediate element 21. For this purpose, the retaining mandrel 25 projects with lateral play through an opening 26 into the basic body 17. It is possible via the retaining mandrel 25 to align the intermediate element 21, and thus the position of the mirror facet 12 perpendicularly to its optical axis 20, on the basic body 17 very easily from the side of the basic body 17 averted from the mirror facet 12. Although the stroke for the adjustment is restricted in this case as a function of the diameter of the retaining mandrel 25 and opening 26, it suffices for most instances, in particular in the case of application in EUV lithography.

The magnetic device 24, which is constructed here as an excitation coil, can be slipped over the retaining mandrel 25. When the magnetic devices 24 are switched on, the retaining mandrel 25 or the intermediate element 21 can itself be permanently magnetized such that after this operation the magnetic device 24 can be removed from the retaining mandrel 25 without the fixed position of the mirror facet 12 being lost again.

The following mode of procedure is used for the adjustment of the mirror facet 12: the mirror facet 12 is inserted into the intermediate element 21, during which the magnetic devices 24 are still not magnetic. The mirror facet 12 is then preadjusted. The magnetic force is turned on at a low level and the mirror facet 12 is readjusted. When the mirror facet 12 is adjusted accurately enough, the magnetic force is switched on fully and the reflecting surface 15 is secured against tilting. The mirror facet 12 is then firmly connected to the intermediate element 21. The intermediate element 21 is firmly connected, furthermore, to the basic body 17 by means of the magnetic forces.

However, it would also be conceivable in principle for the intermediate element 21 already to be firmly connected to the basic body 17 via other connecting techniques further explained later, before the above-described adjusting operation takes place.

FIG. 10 shows an arrangement for mounting on a planar surface of the basic body 17 for the purpose of adjustment by means of lateral displacement. It is necessary here in this case for the basic body 17 also to consist of a magnetic material. Moreover, it is also possible to conceive a version in which, as magnetic device 24, the magnetizing coil is situated outside and can be removed.

A solution for fixing the position of the mirror facet 12 by soldering is indicated by dashes only in FIG. 6. Here, the back surface 19, 19' of the mirror facet 12 has an adhesive, solder and oxidation-protection layer 28 (Cr, Ni, An), and the surface of the basic body 17 also has such a layer packet. The solder is applied either to one or both carrier partners between the solderable layer and the oxidation-protection layer, or is designed as a solder-filled chamber. The soldering itself and exemplary solders are described in EP 0 901 992 A2.

The mode of procedure in the adjustment will in this case be as already described above. The mirror facet 12 is once again inserted into the intermediate element 21 or into the recesses provided therefor in the plate serving as basic body 17 and adjusted, if appropriate, in a number of steps. After the complete adjustment of all the mirror facets 12 of the facet mirror 10 has been performed, the respective joining point or the two adherends is (are) heated until the solder melts and wets both parts. The connection is firm after the solder cools.

A favorable solution for introducing the required heat for soldering can be performed by heating with the aid of IR radiation through the substrate of the mirror facets 12. In this case, the reflecting surface 15 and the substrate must be transparent for the thermal radiation. The advantage of this solution free of flux resides in the fact that no residues of the flux can be produced.

A further alternative for fixing the mirror facets 12 is wringing or bonding. In this case, however, there is a very high risk of uncontrolled wringing. The version of the mirror facet 12 illustrated in FIG. 11 provides a remedy here.

The mirror facet 12 "floats" on a pressure pad p during the adjustment. The pressure pad p is introduced through the opening 26 in the basic body 17 and, if an intermediate element 21 is present, through a bore 27 in the intermediate element 21 under the mirror facet 12. The pressure in the pressure pad is not reduced, or a gas stream that forms the pressure pad is not switched off until after the correct alignment of the mirror facet 12. The mirror facet 12 is then wrung quasi-continuously on the intermediate element 21 such that there is no need here to fear any maladjustment owing to the wringing or bonding. It is advisable in this case for an oxygen-free gas stream to be used as the gas stream, for example, nitrogen or a noble gas, in order if possible to suppress oxidation processes in the region of the entire facet mirror 10.

Apart from in the form illustrated here, all the variants illustrated above are also conceivable in all conceivable combinations, that is to say, for example, also in a combination of wringing the mirror facet 12 on the intermediate element 21 and magnetically retaining the intermediate element 21 on the basic body 17, or by combining magnetic holders and soldering, or the like. In this case, all the methods are to be implemented both with and without the intermediate element 21. All the combinations of the exemplary designs illustrated here are subsumed in the field of the invention.

What is claimed is:

1. A facet mirror, comprising:
   a basic body of bipartite construction, said basic body having a first plate and a second plate which are displaceable and capable of being fixed relative one another;
   a number of mirror facets, each of said mirror facets having a mirror body formed with a periphery, a first side and a reflecting surface opposite said first side;
   a number of bearing devices each extending over both said first and second plates of said basic body, each of said mirror facets being mounted to said basic body so that said periphery of said mirror body thereof contacts one of said bearing devices via surface contact, line contact or point of contact;
   said mirror facets each being adjustable within one of said bearing devices after which time said first and second plates of said basic body are fixed relative to one another to releasably mount said mirror facets and said bearing devices in said adjusted position.

2. The facet mirror as claimed in claim 1, wherein an adjusting device is connected to said first side of each of said mirror bodies, said adjusting devices being effective to adjust the position of said reflecting surface of said mirror facets.

3. The facet mirror as claimed in claim 1, wherein said basic body consists of a softer material than said mirror body.

4. The facet mirror as claimed in claim 1, wherein both of said first and second plates consist of a softer material than said mirror body.

5. The facet mirror as claimed in claim 1, wherein said first plate, is situated closer to the reflecting surface of said mirror body and consists of a harder material than the second plate.

6. An adjusting system for a facet mirror having a number of mirror facets each including a mirror body formed with a periphery, a first side and a reflecting surface opposite said first side, said adjusting system comprising:
   a basic body of bipartite construction, said basic body having a first plate and a second plate which are displaceable and capable of being fixed relative one another;
   a number of bearing devices each extending over both said first and second plates of said basic body, each of said mirror facets being mounted to said basic body so that said periphery of said mirror body thereof contacts one of said bearing devices via surface contact, line contact or point of contact;
   an adjusting device connected to said first side of said mirror body of each of said mirror facets and an actuator coupled to each of said adjusting devices, each of said actuators each being effective to apply a force to one of said adjusting devices to effect adjustment of the position of a respective mirror body after which time said first and second plates of said basic body are fixed relative to one another to releasably mount said mirror facets and said bearing devices in said adjusted position.

7. The adjusting system as claimed in claim 6, wherein said basic body consists of softer material than said mirror body.

8. The adjusting system as claimed in claim 6, wherein both of said first and second plates consist of a softer material than said mirror body.

9. The adjusting system as claimed in claim 6, wherein said first plate is situated closer to said reflecting surface of said mirror body and consists of harder material than said second plate.

10. The adjusting system as claimed in claim 6, wherein the adjustment of said mirror facets is performed, under illumination, in the insert of an objective in which the mirror facets are installed.

* * * * *

UNITED STATES PATENT AND TRADEMARK OFFICE
CERTIFICATE OF CORRECTION

| | | |
|---|---|---|
| PATENT NO. | : 7,090,362 B2 | Page 1 of 2 |
| APPLICATION NO. | : 10/841846 | |
| DATED | : August 15, 2006 | |
| INVENTOR(S) | : Holderer et al. | |

It is certified that error appears in the above-identified patent and that said Letters Patent is hereby corrected as shown below:

Column 1, line 26:
    after "U.S. Patent No. 6,227,673 B" insert --1--
    delete "1" in "U.S. Patent No. 1,4,195,913" and should read --U.S. Patent No. 4,195,913--

Colum 2, line 43:
    insert a --.-- after the word "therefrom"

Colum 2, line 65:
    delete the "," after the word "the"

Column 5, line 13:
    delete "alien" an insert --align--

Colum 5, line 67:
    insert a --.-- after the word "drawings"

Column 6, line 37:
    insert a --.-- after the number "6"

Column 8, line 42:
    insert a --.-- after the word "embodiments"

Column 8, line 49:
    insert a --.-- after the number "1)"

UNITED STATES PATENT AND TRADEMARK OFFICE
CERTIFICATE OF CORRECTION

PATENT NO. : 7,090,362 B2
APPLICATION NO. : 10/841846
DATED : August 15, 2006
INVENTOR(S) : Holderer et al.

It is certified that error appears in the above-identified patent and that said Letters Patent is hereby corrected as shown below:

Column 9, line 32:
    insert a --.-- after the number "17"

Signed and Sealed this

Twenty-seventh Day of March, 2007

JON W. DUDAS
*Director of the United States Patent and Trademark Office*